(12) United States Patent
Marenco

(10) Patent No.: US 8,330,247 B2
(45) Date of Patent: Dec. 11, 2012

(54) SEMICONDUCTOR ARRANGEMENT WITH TRENCH CAPACITOR AND METHOD FOR PRODUCTION THEREOF

(75) Inventor: Norman Marenco, Hohenaspe (DE)

(73) Assignee: Fraunhofer-Gesellschaft zur Förderung der angewandten Forschung e.V. (DE)

( * ) Notice: Subject to any disclaimer, the term of this patent is extended or adjusted under 35 U.S.C. 154(b) by 428 days.

(21) Appl. No.: 12/527,730

(22) PCT Filed: Feb. 20, 2008

(86) PCT No.: PCT/EP2008/001619
§ 371 (c)(1),
(2), (4) Date: Mar. 30, 2010

(87) PCT Pub. No.: WO2008/101738
PCT Pub. Date: Aug. 28, 2008

(65) Prior Publication Data
US 2010/0181645 A1    Jul. 22, 2010

(30) Foreign Application Priority Data
Feb. 20, 2007 (DE) .......................... 10 2007 009 383

(51) Int. Cl.
*H01L 27/06* (2006.01)

(52) U.S. Cl. ........................................ 257/520; 438/125

(58) Field of Classification Search .................. 257/307, 257/309, 502, 503, 508, 516, 520, 532; 438/120, 438/122, 125
See application file for complete search history.

(56) References Cited

U.S. PATENT DOCUMENTS

| | | | |
|---|---|---|---|
| 5,811,868 A | 9/1998 | Bertin et al. | |
| 6,236,103 B1 | 5/2001 | Bernstein et al. | |
| 6,614,645 B1 | 9/2003 | Sakurai et al. | |
| 2001/0050408 A1* | 12/2001 | Bernstein et al. | 257/532 |
| 2005/0029623 A1 | 2/2005 | Kaneko | |
| 2006/0131691 A1 | 6/2006 | Roozeboom et al. | |
| 2007/0001203 A1* | 1/2007 | Lehr et al. | 257/296 |

FOREIGN PATENT DOCUMENTS

| | | |
|---|---|---|
| FR | 2832855 A1 | 5/2003 |
| JP | 2-199862 A | 8/1990 |
| WO | WO-2007/005141 A1 | 1/2007 |

OTHER PUBLICATIONS

"International Application Serial No. PCT/EP2008/001619, International Search Report mailed Jul. 9, 2008", 4 pgs.
"International Application Serial No. PCT/EP2008/001619, Written Opinion mailed Jul. 9, 2008", 5 pgs.
"International Application No. PCT/EP2008/001619, English Translation of International Preliminary Report on Patentability mailed Sep. 17, 2009", 8 pgs.

* cited by examiner

*Primary Examiner* — Thomas L Dickey
(74) *Attorney, Agent, or Firm* — Schwegman Lundberg & Woessner, P.A.

(57) ABSTRACT

The invention relates to a semiconductor arrangement and method for production thereof, wherein the semiconductor arrangement is provided with an integrated circuit arranged on a substrate. The integrated circuit is structured on the front face of the substrate and at least one capacitor is connected to the integrated circuit, wherein the at least one capacitor is designed as a monolithic deep structure in trenches. The trenches are arranged in at least one first group and at least one second group, the trenches of a group running essentially parallel to each other and the first and second group are at an angle to each other, essentially at right angles to each other.

15 Claims, 6 Drawing Sheets

Figure 1:
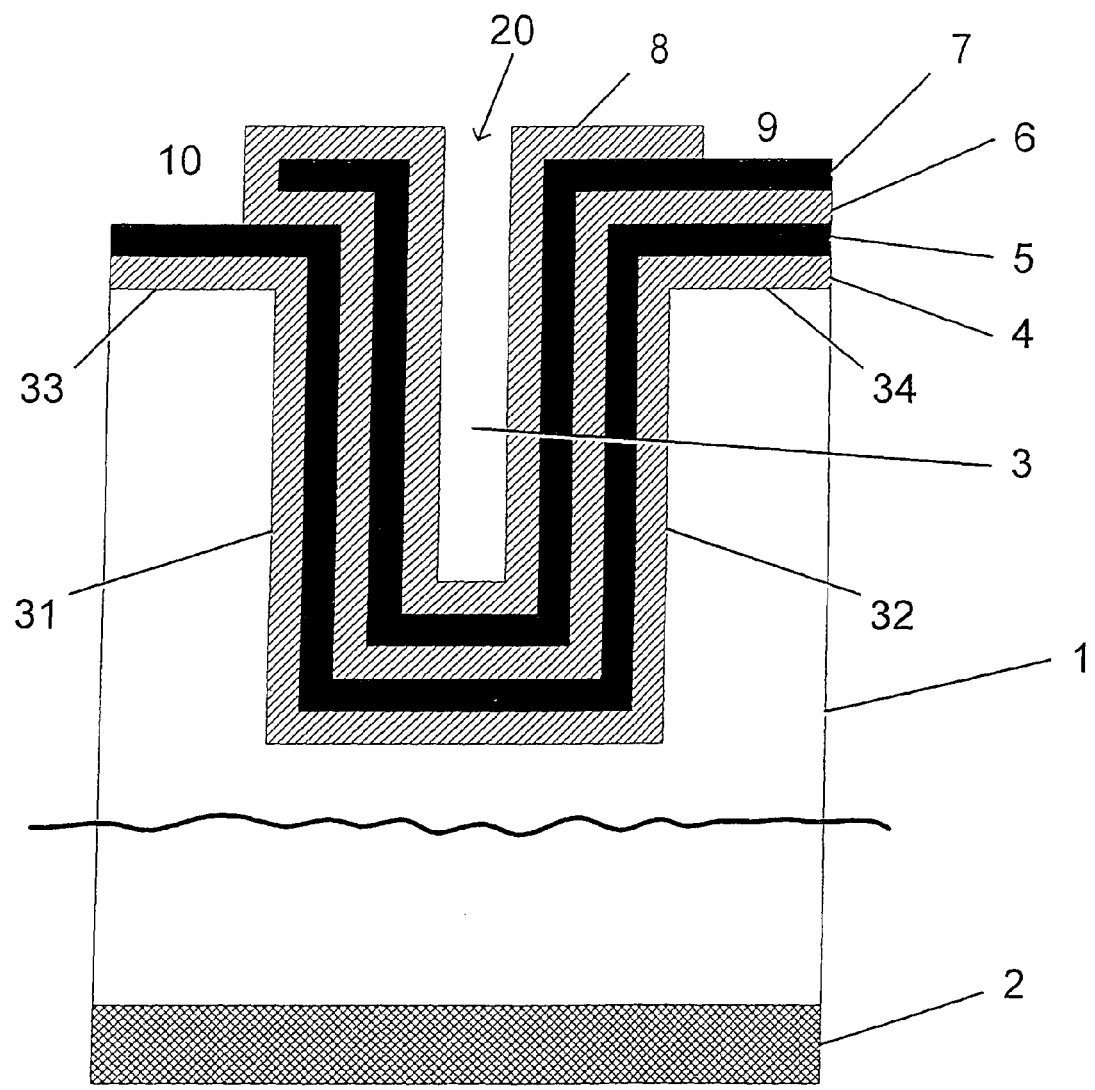

SEMICONDUCTOR ARRANGEMENT WITH TRENCH CAPACITOR AND METHOD FOR PRODUCTION THEREOF

PRIORITY CLAIM TO RELATED APPLCATIONS

This application is a national stage application under 35 U.S.C. §371 of PCT/EP2008/001619, filed Feb. 20, 2008, and published as WO 2008/101738A1 on Aug. 28, 2008, which claims priority to German Application No. 10 2007 009 383.9, filed Feb. 20, 2007, which applications and publication are incorporated herein by reference and made a part hereof in their entirety, and the benefit of priority is claimed thereto.

The invention relates to a semiconductor arrangement according to the preamble of the main claim, as well to a method for manufacturing such a semiconductor arrangement.

With regard to electronics, it is usual to apply so-called back-up capacitors or buffer capacitors which mostly must be placed close to a certain component and whose task is, to filter short current impulses out of the supply leads. These back-up capacitors are common, in particular with integrated circuits, and may seldom be avoided.

Thus for example very high current peaks may occur periodically with the synchronous cycling of processors and other logic circuits, in which peaks the internal transistors are simultaneously connected. Without a buffering of the electricity supply close to the component, the current impulses would cause a high voltage drop over the supply lead on account of Ohm's law. This would result in a brief break down of the operating voltage, by which means a reliable operation of the component could no longer be endured.

In another application, back-up capacitors are used, in order, when detecting a voltage value over a component, to compensate the charge quantity removed by the component from the signal itself. By way of this, the short current impulse of the component does not lead to a great voltage change.

Presently, back-up capacitors and buffer capacitors are designed as discrete, passive components, in which one or more capacitors are realised. These are grouped around the integrated circuit. The surface requirement thereby is considerable, since often 20 or more such separate components are required.

The housings of integrated semiconductor circuits are becoming ever smaller with the increasing integration density of electronic components. Thereby, one talks of chip scale packages, with which the housing is only a little larger than the semiconductor chip itself. This for the construction of the componentry, means that the surface requirement of passive components limits the further miniaturisation, and causes problems for the designer with regard to the disentanglement of the signals in the vicinity of the integrated circuit. Moreover, the passive components represent part of the production costs which may not be significantly reduced.

The document US2006/0131691 A1 attempts to solve the problem by way of introducing the buffer capacitors in trenches on the side of the semiconductor substrate, which is distant to the actual semiconductor circuit. It is possible to accomplish the increasing miniaturisation of the semiconductor circuit by way of this, without filling the saved space with buffer capacitors again. The disadvantage of the solution shown there, lies in the fact that the trenches may only be incorporated in a limited manner without effecting a weakening of the substrate. This amongst other things is due to the fact that after introducing the trenches and the buffer capacitors arranged therein, the semiconductor substrate is subjected to a new etching process, in order to remove necessary sacrificial layers. Large parts of the rear side of the substrate must be provided with capacitor trenches, which are manufacturable by way of deep etching, in order to provide the necessary capacitances for energy storage. These problems are not discussed in detail.

The object on which the invention is based lies on the one hand in the reduction of the space requirement of a semiconductor arrangement and the provision of an adequately large capacitance in the smallest of spaces, without at the same time having to accept a weakening of the substrate.

The object is achieved by a semiconductor arrangement of claim 1 and the method for manufacturing such a semiconductor arrangement.

The semiconductor arrangement comprises a substrate, on whose front side an integrated circuit is structured. Moreover, the integrated circuit is connected to at least one capacitor for energy storage, wherein the capacitor is formed on the rear side of the substrate as a monolithic depth structure with at least two trenches.

The at least two, preferably at least four trenches, are designed in a first group of trenches lying in each case parallel to one another, and in a second group of trenches which in each case lie parallel to one another, wherein the first group and the second group are arranged transversely to one another. Preferably, at least two trenches per group are present. The breakage strength of the substrate is regulated by the geometry of the etching, as well as the ratio of substrate thickness to etching depth. These aspects are dealt with in more detail in the following sections.

The advantage of the semiconductor arrangement according to the invention on the one hand lies in the fact that due to the arrangement of the capacitor on the rear side of the substrate, this capacitor is provided in the integrated semiconductor component itself and is an integral part of this. By way of this, one the one hand the size of the componentry of the semiconductor chip may be smaller compared to solutions in the state of the art, and on the other hand a good buffer performance is possible due to the small distance to the circuit arrangement on the opposite side of the substrate. A further advantage lies in the fact that the capacitor surface which is available may be increased by a multiple compared to a planar structure, on account of the design of the capacitor as a depth structure. Hereby, the surface enlargement, with common techniques which are available for the formation of one or more capacitors, may amount to two orders of magnitude larger than compared to a planar surface. With the help of the enlarged surface, one may achieve a capacitance which is necessary for a back-up or buffer capacitor, in order to accommodate the voltage peaks described in the introduction. In this manner, one may make do without passive back-up capacitors, which are not arranged on the substrate.

The at least one capacitor may be manufactured inexpensively on the rear side of the substrate due to the fact that the depth structure is designed in a monolithic manner. Moreover, the at least one capacitor is designed as a part of the surface of the substrate and by way of this entails a further saving of space compared to the methods known in the state of the art.

One avoids the substrate being excessively loaded in one direction and thus a possible occurrence of breakage in the substrate, by way of the arrangement of the first and second group to one another.

With regard to the capacitors, it is the case of capacitors for energy storage, which on account of their high capacitance, significantly differ from capacitors for storage of information.

Capacitance values of between 1 µF and 25 pF are necessary with the energy storage of supply voltages or digital inputs/outputs of a microchip or with the buffering of an analog input voltage of an analog-to-digital converter, or on filtering voltages, and these values may be provided by the semiconductor arrangement according to the invention.

Advantageous further formations of the subject manner according to the invention are described in the dependent claims.

On advantageous further formation of the subject matter is that the at least one trench of the depth structure has a ratio of depth to width of maximal 100:1, preferably 30:1 to 5:1 before the deposition (application) of the at least one capacitor.

The surface may be increased by up to a factor of between 60 to 200 by way of such a ratio of depth to width. Thereby, the ratio is selected such that the substrate does not undergo too great a weakening, and processes for depositing (applying) the capacitors in the depth structure may operate in an efficient region.

The depth of the trenches is dependent on the substrate thickness. The substrate thickness is usually between 500 µm to 700 µm, but in special cases may also be only 30 µm to 300 µm. On manufacture of the capacitor trenches, recesses between 30% to 80% of the substrate thickness are suitable. The recesses may be created by way of etching or with other methods known from the state of the art.

It is particularly with an arrangement of the capacitors with a substrate with a peripheral contact arrangement, with which e.g. contact bumps are applied, that the necessity exists to arrange the capacitor arrangement in the vicinity of the contacts, i.e. either next to it or below the contacts.

With a normal surface arrangement of the contacts, a raster between the contacts of 100-1000 µm results, so that a first group of trenches could have a length of 80 µm to 950 µm for example. With a second group which may lie between two adjacent contacts, with a width of the trenches between 5 µm to 500 µm, preferably of 10 µm to 100 µm, thus between 6 and 100 trenches may lie next to one another. In this manner, higher capacitance values than the state of the art may be achieved without endangering the stability of the substrate too much.

The number of trenches in one group is preferably selected with a known length of the trenches, such that the group essentially has the shape of a rectangle, preferably a square. In this manner, the space which is available in particular in combination with alternating alignments of the first and second group, is utilised in the best possible manner. The ratio of length to width of a single trench is at least 3:1, preferably at least 10:1, particularly preferably at least 50:1.

In an alternative embodiment of the semiconductor arrangement, the first and the second group may also have trenches in only one alignment, i.e. essentially parallel to one another.

A further advantageous further design of the semiconductor arrangement is for the oblique side walls the trenches to form different angles between 45° and 90° to the planar rear side of the substrate. The choice of the angle thereby depends on the applied manufacturing method of the trenches and in particular on the manufacturing method of the capacitor. Some methods for example do not permit the deposition (application) of capacitor material on very steep side walls, so that the angle must be smaller on account of processing technology. Less established processes permit the deposition of material also in steep or deep structures such as trenches or holes. Thereby, technological embodiments for a low-temperature processing procedure below 400 °C. or even below 200 °C. are industrially available.

A further advantageous further formation of the subject-matter according to the invention is when the deposited capacitor extends past several trenches.

One further advantageous arrangement is given by way of a feedthrough being present between the front side and the rear side of the substrate. A particularly efficient and quick possibility of connecting the back-up capacitor attached on the rear side, to the integrated circuit on the front side, results on account of this. This prevents a high voltage drop over the supply leads. Advantageously, the feedthroughs are incorporated in the same working step as the trenches or capacitors. Different etching rates result on account of the surface share of the openings and their geometry. With the same etching time, one etches more rapidly through a large mask opening than through a smaller mask opening. A larger mask opening is selected for a feedthrough than for the trenches. Given a round mask opening for a feedthrough with a cross-sectional area A, the mask openings of the trenches are smaller than A, wherein the length of the trench may be very much larger than the diameter of the round mask opening, and the larger length is compensated by a narrower width. The feedthroughs are etched up to the front side in this manner, and the trenches, depending on the cross-sectional area, only have a depth of 30% to 80%, e.g. 70% of the substrate thickness.

One further advantageous formation of the invention is that the capacitor is constructed in a layer-like manner of at least three layers, wherein at least one layer is formed by a dielectric between at least two conductive layers. The layer-like construction is suitable for inexpensively manufacturing the at least one capacitor.

The dielectric is advantageously manufactured of silicon nitride or of an oxide, for example silicon oxide or tantalum oxide, wherein a typical layer thickness lies between 40 and 400 nm. The first and/or the second conductive layer are preferably of an aluminium alloy or copper or wolfram.

It is further advantageous if the layers of the capacitor extend not only in the trenches but are also applied beyond these and in particular are contactable outside the trench.

A further advantageous formation of the subject matter is to deposit the first conductive layer of the capacitor on at least one wall of the at least one trench and to deposit the dielectric on the first conductive layer, and a second conductive layer on the dielectric. This further formation is particularly advantageous when the first conductive layer covers the complete surface of a trench, wherein as the case may be, a passivation layer for insulation is deposited between the surface of the trench and the first conductive layer. On account of this, on the one hand the distance of the capacitor plates to one another may be reduced, and on the other hand the capacitor surface may extend over the complete surface of a trench.

Another advantageous design of the semiconductor arrangement is if a conductive layer of the capacitor is deposited along at least one wall of a trench of the depth structure and a second layer side deposited on a further wall of the at least one trench, said further wall being distanced to the first wall. One advantage of such a semiconductor arrangement is the fact that two oppositely lying conductive layers which in each case are electrically insulated from one another by a dielectric, such as for example a nitride, an oxide, an organic or polymerised compound or also air, construct a capacitor in each trench of a depth structure. Thereby, the differently poled layers are deposited lying mutually opposite on different trench walls. Hereby, it is particularly advantageous if the two oppositely lying trench walls represent the two walls with the largest surface.

The method according to the invention is to be dealt with in more detail hereinafter.

According to the method according to the invention, at least one trench is incorporated into the rear side of a substrate, wherein an integrated circuit is present on the front side. By way of this, the surface which is available for forming buffer capacitors is increased. In a further step, the first conductive layer of the at least one capacitor is deposited into the at least one trench, onto which in turn a dielectric layer and a second conductive layer of the at least one capacitor is deposited in at least one trench.

With the manufacturing method, all work for incorporating and contacting of the trenches is carried out from the rear side of the substrate. Amongst other things, this has the advantage that the front side of the substrate does not have to be provided with a sacrificial layer which has to be removed later. This is particularly advantageous if the trenches and the feedthroughs are manufactured in the same working step. Hereby, the layers which are deposited on manufacture of the integrated circuit are used in order to stop the etching attack directly below the present contact surfaces of the circuit. The feedthroughs therefore remain permanently and not just temporarily closed. For this reason, one may make do without a front-side sacrificial layer for the protection of the circuit, since all structuring processes of the trenches and of the feedthroughs are carried out from the rear side.

A space-saving inexpensive structure may be created by way of such a manufacturing method. Moreover, one ensures that the advantages described in the previously paragraphs are retained in the semiconductor arrangement.

One particularly advantageous manufacture of the trench arrangement may be realised with the help of an anisotropic, ion-aided dry-etching or of laser-aided etching.

Advantageous further formations of the method according to the invention are described in the dependent claims of the method.

Figure 2:
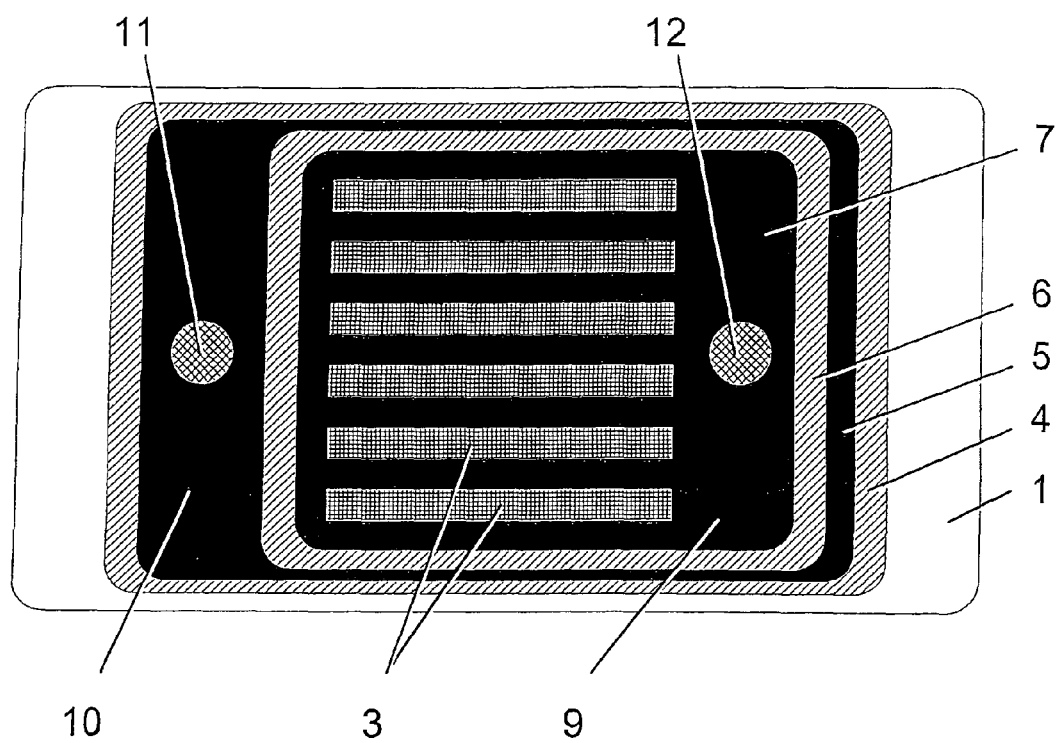
Figure 3:
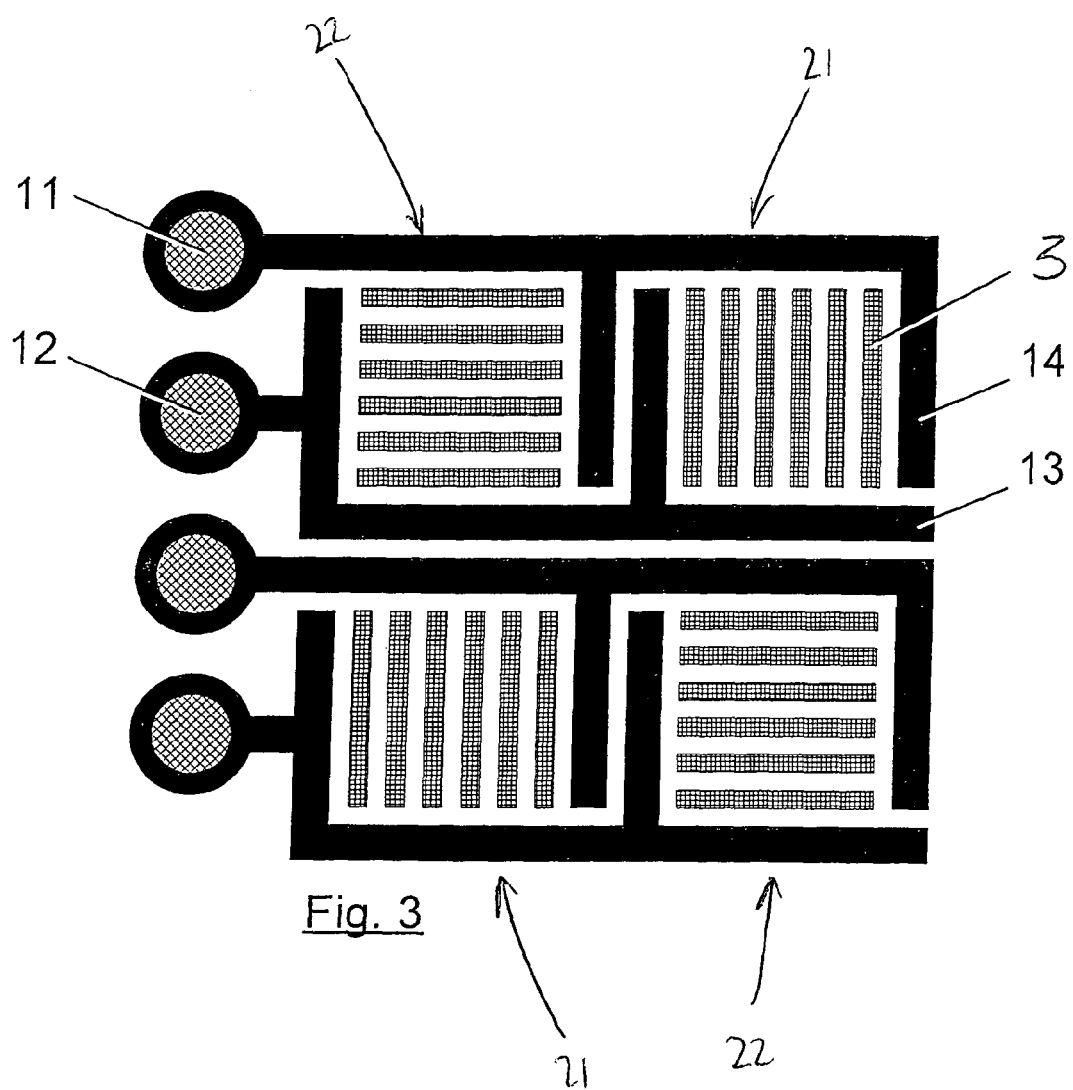
Figure 4:
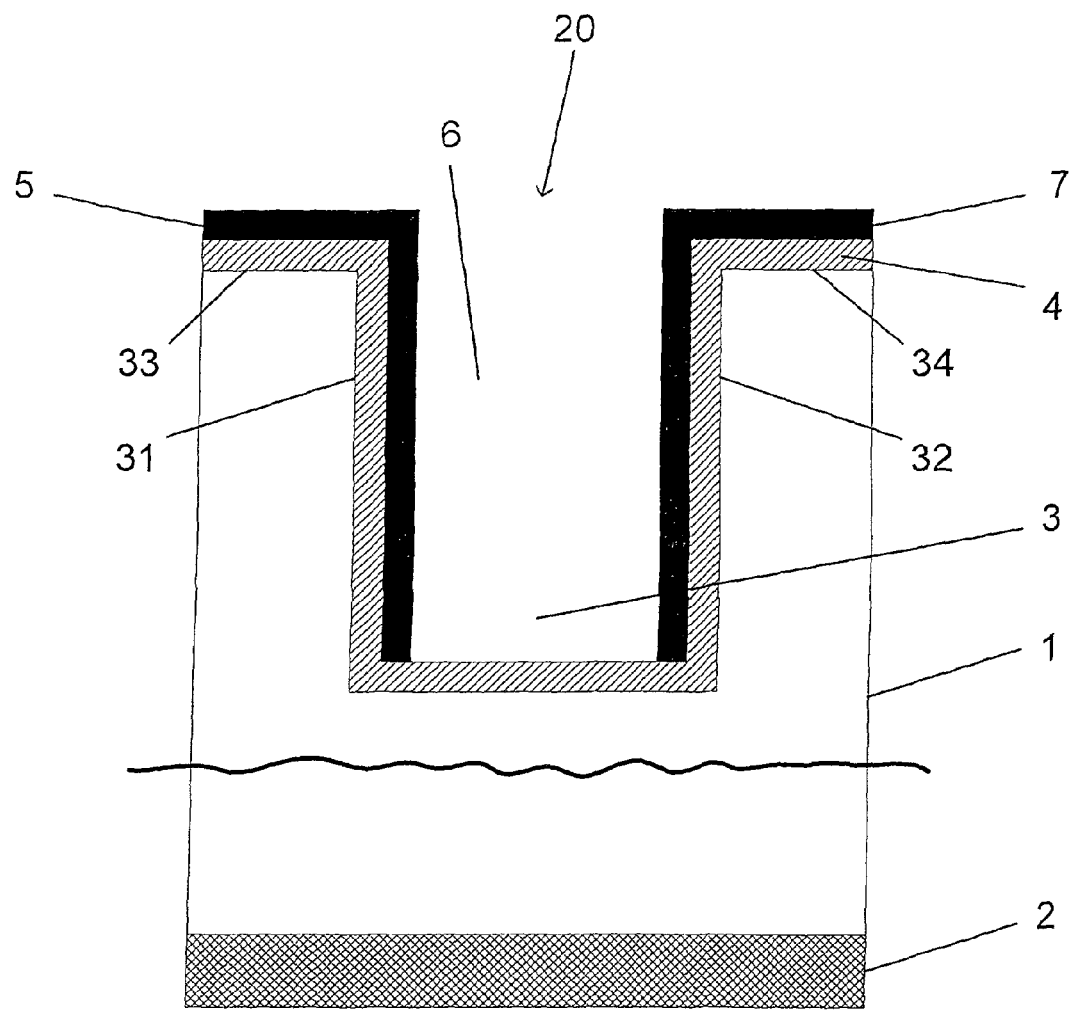
Figure 5:
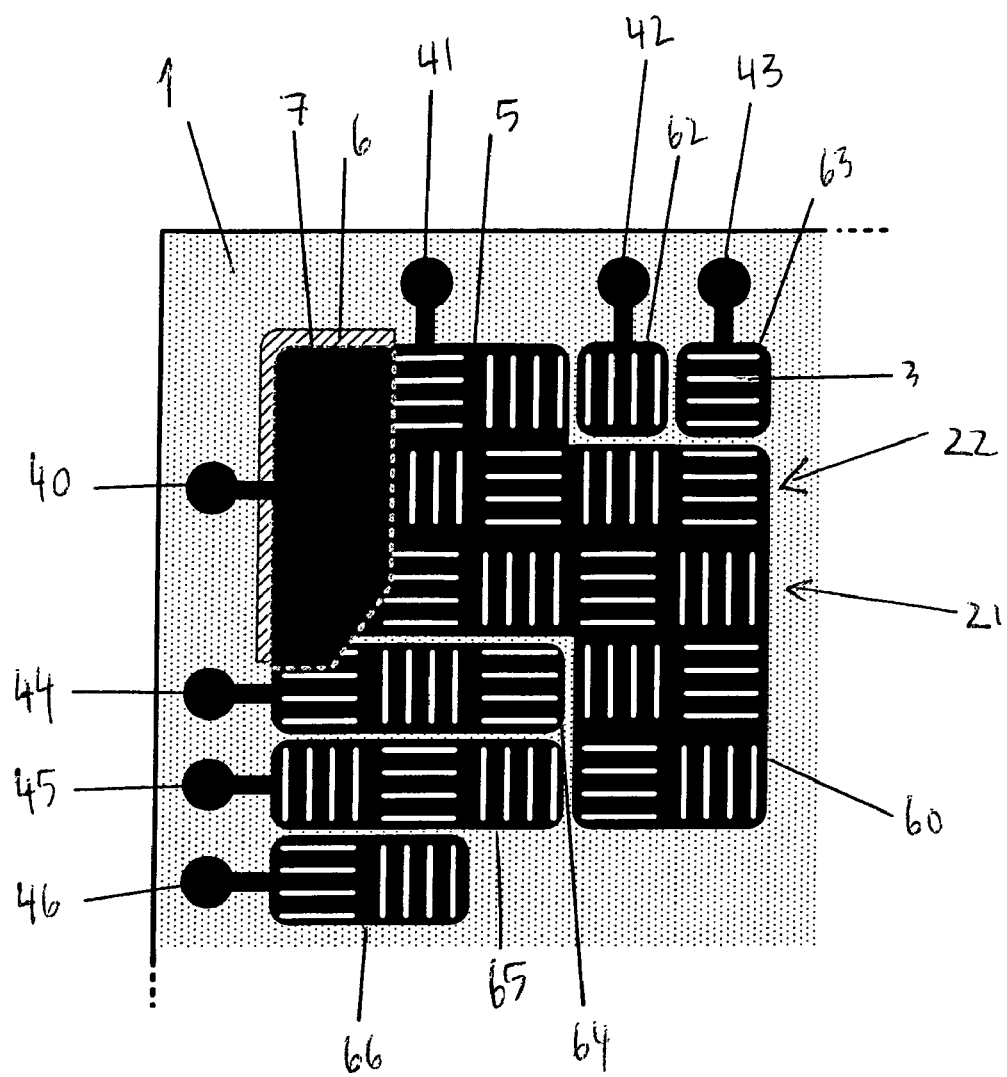
Figure 6:
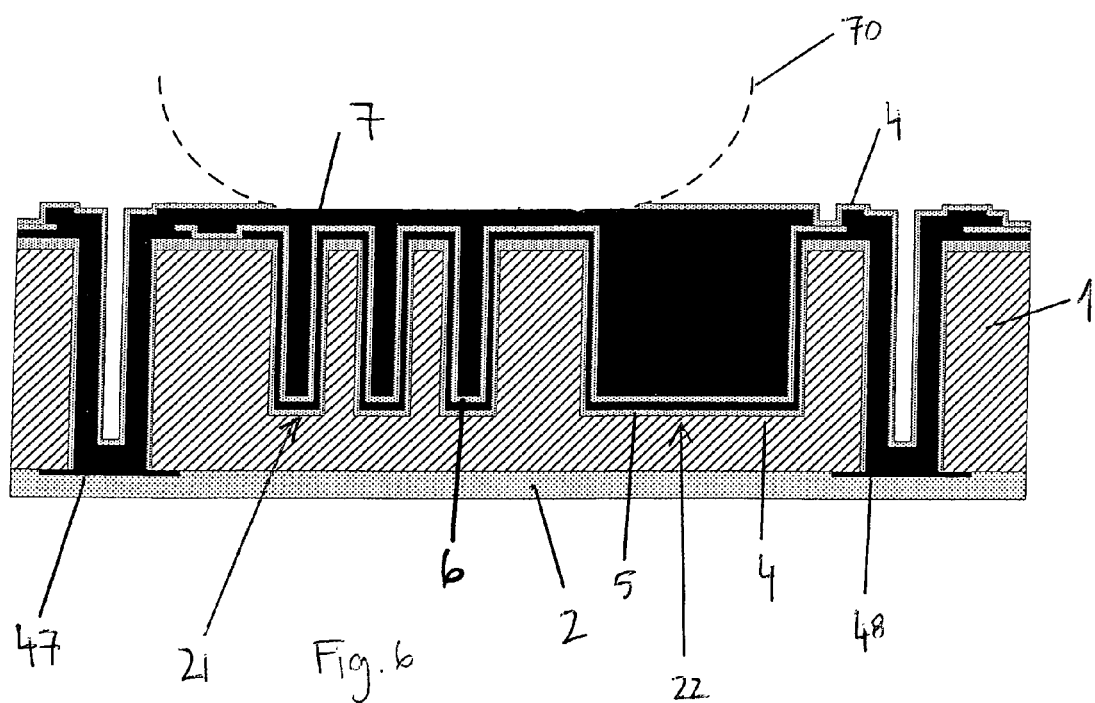

The invention is hereinafter described in more detail by way of one embodiment example. There are shown in:

FIG. 1 a cross section of a semiconductor arrangement according to the invention, FIG. 2 a plan view of the rear side of a semiconductor arrangement according to the invention, FIG. 3 an alternative arrangement of strip conductors, FIG. 4 a cross section of an alternative semiconductor arrangement according to the invention, FIG. 5 a detail of a rear side with one embodiment of a semiconductor arrangement according to the invention;

FIG. 6 a cross section of one embodiment of a semiconductor arrangement according to the invention.

FIG. 1 shows a detail of one embodiment of a semiconductor arrangement according to the invention, in cross section. This comprises a substrate 1, on whose front side an integrated circuit 2 is arranged. A capacitor which is constructed of several layers 4 to 8, is located on the rear side. The layer-like capacitor 20 thereby runs along the surface of the rear side of the substrate 1, which has a depth structure with a trench 3. Thereby, the capacitor 20 with the substrate is designed as a monolithic depth structure.

For manufacturing the capacitor 20, firstly at least one trench 3 is introduced into the substrate 1 from the rear side. A passivation layer 4 is arranged directly on the surface of the rear side of the substrate 1 with trenches 3. This layer runs along the planar surface 33 of the rear side of the substrate 1 and along the straight walls 31 and 32 of the trench 3 and outside the trench again along the planar surface 34 of the substrate 1.

A conductive layer 5 is deposited onto the passivation layer 4. The conductive layer 5 is separated from a conductive layer 7 by way of a dielectric layer 6 deposited on the conductive layer. By way of this, a capacitance may be formed between the conductive layer 5 and the conductive layer 7, and may be provided via supply leads of the circuit arrangement 2 on the front side of the substrate 1. Different chemical or physical deposition methods may be used for depositing the different layers, such as for example inorganic or metal-organic gas phase deposition, sputtering, vapour deposition or electrolytic deposition.

It may be easily recognised by way of FIG. 1 as to how the deposition of a depth structure with a trench 3 or several trenches 3 which are not drawn in for the purpose of a better overview, may increase the surface of a capacitor by a multiple. In contrast to a planar arrangement, a much larger surface may be achieved with the help of the trenches.

The enlargement of the surface thereby depends essentially on the outer dimensions of a trench 3. Hereby, it is possible with present technologies to realise a trench widths of about 10 μm up to a depth of more than 200 μm, by which means a surface enlargement by the factor of 40 may be achieved. Further increases of the surface enlargement may be realised by way of deeper trenches, so that at least a factor of 100 may be achieved.

The conductive layers are deposited onto the surface of the rear side of the substrate beyond the edge of the trench, wherein a further passivation layer as a protection and insulation is deposited onto the second conductive layer. The first conductive layer 5 is contacted via the region 10, and the conductive layer 7 via the region 9.

The rear side of a further embodiment example is shown in a plan view in FIG. 2, wherein the monolithic depth structure is realised with several trenches 3 arranged in parallel. The trenches of FIG. 2 form a first group 21.

The depth structuring may be differentiated in a multiple manner in the region of monolithic solutions. Trenches as well as holes may be manufactured, which may be further differentiated with regard to the shape and the inclination of the side walls. The specific embodiment may thereby be inherent of the process procedure, e.g. by way of the application of wet-chemical methods, or however on the other hand by way of the deliberate control of the etching parameters, e.g. with anisotropic ion-aided dry etching, as well as by way of the design of the etching mask. The motivation for a deliberate setting of the side wall inclination may lie in an improved control of the subsequent layer deposition, which results from this. However, other methods are known, which permit a compliant deposition in depth structures such as trenches and holes, in particular the deposition on perpendicular walls, as shown in FIG. 1. Further possible methods, the plasma-aided chemical vapour deposition, hot-wire aided chemical vapour deposition and gas-flow sputtering are possible, additionally to the previously mentioned methods.

In FIG. 2, the layers 4 to 7 run in a surfaced manner along all trench walls of the trenches 3. The course within a single trench 3 is thereby shown as in FIG. 1. Thereby, different trenches lying next to one another are connected to one another via the planar sections 33, 34. In particular, this design of the semiconductor arrangement according to the invention may be realised in a particularly simple manner, if the layers 4 to 7 are in each case deposited in a single-layered manner and one after the other, after depositing the depth structure in the form of trenches 3. Basically, also several capacitors may be arranged on the rear side of the substrate. Thereby, a capacitor extends only over a part quantity of the present trenches. The different capacitors may then be effectively activated separately from one another or connected into one capacitor.

Schematic feedthroughs 11 and 12 are also drawn in FIG. 2. The feedthrough 11 connects the conductive layer 5 to the front side of the substrate. Analogously to this, the feedthrough 12 connects the conductive layer 7 to the front side of the substrate 1. Moreover, the feedthroughs 11 and 12 are realised during the incorporation of the trenches. The dimensions of the feedthroughs are represented in a greatly enlarged manner for clarity.

Common methods are possible for manufacturing the trenches and the feedthroughs. In particular, dry-etching, advantageously anisotropic ion-aided dry etching is suitable for depositing the feedthroughs or the trenches themselves. Laser-aided etching methods are also conceivable for this.

A depth structure with trenches is shown in FIG. 3, wherein the trenches do not critically weaken the stability of the substrate 1 on account of the alternating geometric trench designs. Hereby, trenches are grouped and arranged in each case in a first group 21 parallel or transversely to a second group 22.

By way of this, a depth structure may be introduced into the substrate 1, which does not endanger the stability of the substrate itself. The best possible dimensions of the individual trenches have already been dealt with in the general description.

Moreover, connection strip conductors 13 and 14 are drawn, which in each case connect two of the four schematically represented capacitors 20 to one another and likewise may serve for the electrical connection of the capacitors 20 to the circuit arrangement 2 situated on the front side of the substrate.

Hereby, one may clearly recognise that the trenches 3 of the first group 21 and the trenches 3 of the second group 22 are designed essentially perpendicularly to one another. Moreover, the ratio between the distances of the feedthroughs 11 and 12 as well as the size of the respective groups 21 and 22 are represented.

An individual capacitor 20 extends analogously to FIG. 2 over the complete surface of a first or second group.

In the embodiment example shown here, the depth structure is realised by way of trenches 3. However, other geometries are also conceivable depending on the stability of the applied substrate. Holes or concentric circles are e.g. counted amongst these. As already mentioned, the shape and inclination of the side walls 31, 32 may differ from the steep design shown here.

A further embodiment example of a trench with a capacitor is shown in FIG. 4. Thereby, the two conductive layers 5, 7 of the capacitor 20 are not arranged on one another as in FIG. 1, but in each case on different trench walls 31 and 32 lying opposite one another. In this example, the dielectric 6 consist of an air layer. Of course, other materials may also be applied as a dielectric.

The embodiment example in FIG. 4 may be created by way of depositing a conductive material in the completed trenches 3. After the deposition of the conductive material, this is separated into two separate regions 5, 7 for example, by way of etching a part of conductive material. However, the conductive layers 5, 7 may also be deposited separately onto the distanced walls 31, 32.

With the presence of a multitude of trenches 3, the conductive layers 5 and 7 of several or all trenches may be connected to one another, and one may realise the desired large capacitance of the capacitor in this manner.

Wafers, e.g. of silicon or silicon germanium or other known semiconductors are suitable as a substrate material for the semiconductor arrangement.

The described solutions have the advantage of an increased integration rate compared to a discrete realisation on the componentry plane.

The trenches may be manufactured in the same process step as the feedthroughs, which would permit a manufacture of the arrangement according to the invention with common methods in an inexpensive manner. Hereby, with a good process control, a capacitive adaptation of the capacitors to the integrated circuit may be effected if the capacitor is applied e.g. as a filter.

The embodiment forms shown here are of particular interest with components which have an increased requirement with regard to buffer capacitances and filter capacitances and are applied in greatly miniaturised applications, such as mobile communication. Such components are in particular microcontrollers and digital signal processors. The application is also advantageous in picture sensors, above all if these are provided with capacitors and feedthroughs in the same process procedure, since this permits a particularly efficient construction technology in the manufacture of componentry.

A further field of application are charging pumps, with which a low input voltage is conveyed into a higher exit voltage by way of alternately connecting capacitances in parallel and series.

With the above described dimensions of a trench with a length of 250 μm to 950 μm, with a width of 10 μm to 100 μm and a depth of 200 μm to 500 μm, with the application of an aluminium alloy as a first and second conductive layer and whilst using silicon oxide as a dielectric, wherein the layer thickness of the dielectric lies between 10 nm to 400 nm and the at least three layers are arranged above one another accruing to FIG. 1, one may achieve a capacitance of 600 pF/mm$^2$ to 22'000 pF/mm$^2$, i.e. with a surface area of 0.1065 mm$^2$ to 1.145 mm$^2$ per trench (compared to 0.0025 mm$^2$ to 0.095 mm$^2$ with a conventional arrangement) one may achieve a capacitance of 64 pF to 25.2 nF per trench. This with a number of 10 to 50 trenches per group results in capacitance of somewhat more than 640 pF to more than 1.25 μF per group. The back-up capacitors may thus provide capacitances over a very large range, depending on the dimensions and number of trenches.

In FIG. 5, a detail of the rear side of a substrate 1' is shown. A complex integrated CMOS-circuit is arranged on the front side of the substrate. The integrated circuit present on the front side is electrically contacted with the rear side by way of feedthroughs 40, 41, 42, 43, 44, 45, 46.

The detail shown in FIG. 5 shows a corner of the substrate with a peripheral arrangement of the contacts. Moreover, numerous trenches in the form of first and second groups 51, 52 are shown, wherein the trenches and partly the intermediate spaces between the trenches of a group are provided with a first conductive layer 5. A dielectric layer 6 is vapour deposited on this first conductive layer 5 and for reasons of a better overview is only drawn in a part region 53 of the substrate. The same applies to the second conductive layer 7, which is likewise only show as a detail. The dielectric layer 6 as well as the second conductive layer, are however correspondingly arranged on the first conductive layer 5. The second conductive layer is thereby continuous and provided with an earth connection.

The multitude of first and second groups of trenches is coated with capacitors, wherein a capacitor is arranged in one or more groups. The capacitor 60 comprises seventeen first and second groups (three are covered by the drawn dielectric layer 6), wherein the number may be infinitely increased. The capacitor 60 is connected to the feedthroughs 40, 41, which form the earth connection and the connection for the supply voltage for a CMOS-circuit of the front side. The capacitor 60 has a large capacitance in the region of the preceding sections, in order to adequately buffer the supply voltage.

The capacitors 61, 62 in each case comprise only one first and second group. They are likewise connected to the mass connection of the capacitor 60. The second electrically conductive layer 7 engages over the first conductive layer 5 of the capacitor 60 as well as of the other capacitors 62 to 66, but is only shown in the section in the top left corner and cut open outside this. The capacitors 61, 62 have a lower capacitance than the capacitor 60 and are in each case connected to feedthroughs 42, 43, which represent oscillator inputs. As initially mentioned, the required capacitances for oscillator inputs are smaller with a supply voltage of e.g. a CMOS-circuit.

The capacitors 64, 65 are connected to the feedthroughs 44, 45, which are digital I/O contacts. The capacitance demand is lower than with the capacitor 60, but larger than with the capacitor 62 and 63. The capacitor 66 is connected to the feedthrough 46, which forms an analog input. The capacitance moves between the capacitances of the capacitors 64 and 62.

As already described in one of the preceding sections, the holes for the feedthroughs are manufactured in the same working step as the trenches of the first and second groups.

FIG. 6 shows the cross section through an arrangement of capacitors, which are grouped in a first group 21 and a second group 22. A contact bump 70 in the form of a solder ball is deposited on the first and second group. The trenches of the first as well as the second group have been completely closed on depositing the second conductive layer 7. In this manner, one creates a closed surface for contacting the solder ball. Feedthroughs 47, 48 are visible on the left and right of the trenches and reach up to the front side of the substrate and contact the circuit 2. The feedthrough 47 is an earth connection, and the feedthrough 48 is a supply voltage. The feedthrough 48 is connected to the fist conductive layer 5, the feedthrough 47 to the second conductive layer 7. Moreover, a dielectric layer 6 and a passivation layer 4 are drawn in. The feedthroughs are not designed in an open, but in a closed manner, i.e. the layer of the circuit 2 which comprises one or more CMOS-circuits is not engaged or pierced on incorporating the feedthroughs, but merely contacted. This leads to the fact that no sacrificial layer needs to be deposited on the front side of the substrate for the protection of the circuit 2.

The invention claimed is:

1. A semiconductor arrangement with an integrated circuit arranged on a substrate, wherein the integrated circuit is structured on the front side of the substrate, and at least one of one or more capacitors is connected to the integrated circuit, and the one or more capacitors are formed on the rear side of the substrate as a monolithic depth structure in a plurality of trenches wherein the plurality of trenches includes a first group of parallel trenches and a second group of parallel trenches, wherein the trenches of the second group are arranged transversely to the trenches of the first group, wherein each trench has a depth, a width, and a length, and wherein the depth is greater than the width and the length is greater than the width.

2. The semiconductor arrangement according to claim 1, wherein a ratio of the depth to the width is maximally 100 to 1, preferably between 30 to 1 and 5 to 1.

3. The semiconductor arrangement according to claim 1 wherein the trenches have side walls, wherein the side walls form an angle in the region between 45° and 90°, preferably essentially 90°, with a planar surface of the substrate.

4. The semiconductor arrangement according to claim 1, wherein at least one of the one or more capacitors extends over at least two trenches.

5. The semiconductor arrangement according to claim 1, wherein at least one feedthrough is formed between the front side and the rear side of the substrate, for the electrical connection of at least one of the one or more capacitors.

6. The semiconductor arrangement according to claim 1, wherein at least one of the one or more capacitors is constructed of at least three layers, wherein at least one layer is formed by a dielectric arranged between two conductive layers.

7. The semiconductor arrangement according to claim 1, wherein a first conductive and/or the second conductive layer of at least one of the one or more capacitors engages over the edges of at least one trench of the plurality of trenches for forming connection surfaces.

8. The semiconductor arrangement according to claim 1, wherein a first conductive layer of at least one of the one or more capacitors is deposited on the whole surface of at least one trench of the plurality of trenches, as the case may be, with a passivation layer deposited between the at least one trenches and the first conductive layer, the dielectric is arranged on the first conductive layer, and a second conductive layer is arranged on the dielectric.

9. The semiconductor arrangement according to claim 1, wherein the trenches of the second group are arranged essentially perpendicular to the trenches of the first group.

10. A method for manufacturing semiconductor arrangements, wherein the semiconductor arrangement comprises a substrate, and an integrated circuit is present on the front side of the substrate, wherein the from side has no sacrificial layer, and the rear side of the substrate has a depth structure with a plurality of trenches and one or more capacitors, wherein each trench has a depth, a width, and a length, and wherein the depth is greater than the width and the length is greater than the width, which method comprises:
incorporating the plurality of trenches into the rear side of the substrate, the plurality of trenches including a first and a second group parallel trenches, wherein the first group of parallel trenches and the second group of parallel trenches are introduced, and the trenches of the second group are arranged transversely to the trenches of the first group; and
depositing one or more capacitors into the first group and into the second group.

11. The method according to claim 10, wherein at least one of the one or more capacitors is constructed in a layer-like manner, and the layers are deposited onto the substrate provided with the trenches.

12. The method according to claim 10, wherein at least one feedthrough is introduced into the substrate, between the integrated circuit on the front side of the substrate and at least one of the one or more capacitors on the rear side of the substrate, in a manner such that the at least one capacitor is connected to the integrated circuit.

13. The method according to claim 10, wherein the plurality of trenches are manufactured by way of dry-etching, in particular anisotropic, ion-aided dry etching or laser-aided etching methods.

14. A semiconductor arrangement with an integrated circuit arranged on a substrate, wherein the integrated circuit is structured on the front side of the substrate, and at least one of one or more capacitors is connected to the integrated circuit, and the one or more capacitors are formed on the rear side of the substrate as a monolithic depth structure in a plurality of trenches, wherein the one or more capacitors extend through the plurality of trenches and the plurality of trenches includes a first group of parallel trenches and a second group of parallel trenches, wherein the trenches of the second group are arranged transversely to the trenches of the first group, wherein each trench has a depth, a width, and a length, and wherein the depth is greater than width and the length is greater than the width.

15. A semiconductor arrangement with an integrated circuit arranged on a substrate, wherein the integrated circuit is structured on the front side of the substrate, and at least one of one or more capacitors is connected to the integrated circuit, and the one or more capacitors are formed on the rear side of the substrate as a monolithic depth structure in a plurality of trenches wherein the plurality of trenches have a depth and a width and a length, wherein the depth is greater than the width and the length is greater than the width, and wherein the ratio of the depth to the width is maximally 100 to 1 and minimally 5 to 1.

* * * * *

UNITED STATES PATENT AND TRADEMARK OFFICE
CERTIFICATE OF CORRECTION

PATENT NO. : 8,330,247 B2  
APPLICATION NO. : 12/527730  
DATED : December 11, 2012  
INVENTOR(S) : Norman Marenco Page 1 of 1

It is certified that error appears in the above-identified patent and that said Letters Patent is hereby corrected as shown below:

On the Title page, in column 1, under item "(73) Assignee", line 3, delete "e.V." and insert --E.V., Munchen--, therefor In the Claims In column 10, line 34, in Claim 10, delete "from" and insert --front--, therefor In column 10, line 42, in Claim 10, after "group", insert --of--, therefor Signed and Sealed this  
Seventeenth Day of February, 2015

Michelle K. Lee  
*Deputy Director of the United States Patent and Trademark Office*